(12) United States Patent
Thallner

(10) Patent No.: US 8,087,708 B2
(45) Date of Patent: Jan. 3, 2012

(54) HANDLING DEVICE AND HANDLING METHOD FOR WAFERS

(76) Inventor: Erich Thallner, St. Florian (AT)

( * ) Notice: Subject to any disclaimer, the term of this patent is extended or adjusted under 35 U.S.C. 154(b) by 0 days.

(21) Appl. No.: 13/024,439

(22) Filed: Feb. 10, 2011

(65) Prior Publication Data

US 2011/0133500 A1 Jun. 9, 2011

Related U.S. Application Data

(62) Division of application No. 11/770,004, filed on Jun. 28, 2007, now Pat. No. 7,909,374.

(30) Foreign Application Priority Data

Jul. 7, 2006 (DE) .......................... 10 2006 031 434

(51) Int. Cl.
*B65G 49/07* (2006.01)
(52) U.S. Cl. ......... 294/212; 294/213; 294/185; 414/941
(58) Field of Classification Search .................... 294/1.1, 294/64.1, 86.4, 119.3, 212, 213, 185; 414/941; 269/21
See application file for complete search history.

(56) References Cited

U.S. PATENT DOCUMENTS

| 4,778,326 A | 10/1988 | Althouse et al. .............. 414/800 |
| 4,921,564 A | 5/1990 | Moore ........................... 156/344 |
| 5,423,716 A | 6/1995 | Strasbaugh ................... 451/388 |
| 5,849,139 A | 12/1998 | Miyakawa et al. ........... 156/556 |
| 5,916,015 A | 6/1999 | Natalicio ....................... 451/288 |
| 6,383,606 B2 | 5/2002 | Broyles .......................... 428/156 |
| 6,541,989 B1 | 4/2003 | Norris et al. ................... 324/755 |
| 6,716,084 B2 | 4/2004 | Basol et al. ......................... 451/4 |
| 7,632,374 B2 * | 12/2009 | Ozono et al. .................. 156/707 |
| 2002/0151260 A1 | 10/2002 | Crevasse et al. .............. 451/288 |
| 2005/0221722 A1 | 10/2005 | Cheong .......................... 451/28 |

FOREIGN PATENT DOCUMENTS

| EP | 1 080 841 | 3/2001 |
| EP | 1 304 728 | 4/2003 |
| JP | 9-108983 | 4/1997 |
| JP | 10-128634 | 5/1998 |
| JP | 2002-265040 | 9/2002 |
| JP | 2004-79613 | 3/2004 |
| JP | 2005-93938 | 4/2005 |
| JP | 2006-000930 | 1/2006 |
| WO | WO 02/059947 | 8/2002 |
| WO | WO 2005/005096 | 1/2005 |
| WO | WO 2005/098522 | 10/2005 |

OTHER PUBLICATIONS

Notification of Reasons for Rejection (dated May 10, 2011) issued in connection with corresponding Japanese Patent Application No. 2007-178652, with English translation.

* cited by examiner

*Primary Examiner* — Dean Kramer
(74) *Attorney, Agent, or Firm* — Kusner & Jaffe

(57) ABSTRACT

The invention relates to a handling device and to a handling method for wafers, in particular for wafers with a thickness of less than 100 μm. According to the invention it is provided that an adhesive membrane is arranged so as to delimit at least one workspace, the volume of which can be changed by supplying or removing pressurising medium, and in that the size of the contact surface between the adhesive membrane and the wafer can be adjusted by changing the workspace volume.

7 Claims, 6 Drawing Sheets

HANDLING DEVICE AND HANDLING METHOD FOR WAFERS

RELATED APPLICATIONS

This application is a divisional of U.S. application Ser. No. 11/770,004 (filed Jun. 28, 2007) now U.S. Pat. No. 7,909,374, claiming priority from DE 10 2006 031 434.4 (filed Jul. 7, 2006), said patent applications hereby incorporated by reference.

FIELD OF THE INVENTION

The invention relates to a handling device and to a handling method for wafers.

BACKGROUND OF THE INVENTION

In semi-conductor technology it is necessary to transport wafers, or parts of wafers, in different stages of manufacture and to deposit them in various processing apparatuses. For this purpose the wafers are fixed to a handling device which takes on this transportation task. There exist a wide variety of possibilities for fixing the wafers. The most common method consists in depositing the wafer on a board with vacuum grooves and fixing it thereto by connecting a vacuum. It is also known to clamp the wafer to the edge, wherein damage can occur to the wafer hereby. In addition it is known to fix the wafer to an adhesive film, as is primarily used in wafer sawing operations. Still other methods fix a wafer by gluing to a holding device, wherein as a result of different effects, such as UV light or the effects of temperature, these glued joints are constructed so as to either hold permanently or in other cases the gluing property is designed so as to be non-captive.

All of said fixing methods are only conditionally suitable or not suitable at all for fixing extremely thin wafers. Standard wafers have a thickness of approximately 300 to 800 µm. There is a need however to fix wafers with a thickness of about 2 to about 80 µm and to be able to transport them back and forth between various processing stations without damage. Extremely thin wafers of this type are not flat like the standard wafers but, owing to their low thickness and their prior processing steps, are very undulated as a result of the introduction of warping. Regardless of said problems of fixing thin wafers of this type in order to transport and/or planarise them, owing to their crystalline structure the extremely thin wafers are also highly susceptible to fracture.

SUMMARY OF THE INVENTION

The object underlying the invention therefore is to propose a handling device that operates in an extremely gentle manner as well as a corresponding handling method for wafers which is particularly suitable for transporting wafers with a thickness of less than 100 µm.

This object is achieved in terms of the device by the features and method disclosed herein.

Advantageous developments of the invention are disclosed in the subclaims.

The invention is based on the idea of developing the handling device in such a way that there is the lowest possible introduction of force into the wafer as the wafer is received and/or deposited. When receiving a wafer onto the handling device or when releasing the wafer from the handling device, the operations proceed very delicately according to the invention, whereby the risk of destroying the extremely thin wafer is reduced. According to the invention an adhesive membrane is provided which is part of a workspace with a changeable volume. By increasing the pressure in the workspace, i.e. by supplying a pressurising medium into the workspace by way of at least one supply channel, the contact surface can be increased or reduced depending on the configuration of the workspace, whereby the size of the contact surface between the adhesive outer side of the adhesive membrane and the wafer changes. Skilled control of the supply or removal of pressurising medium can have an effect on the receiving or detachment process of the wafer from the adhesive membrane. The provision of a workspace with a changeable volume and which encompasses the adhesive membrane means that the forces exerted by the adhesive membrane on the wafer can be minimised and the force characteristic shaped in such a way that there is no one-sided introduction of force along the crystalline structure of the wafer, which would lead to the wafer or part of the wafer fracturing. In particular the introduction of force may be increased slowly and does not take place abruptly as with known devices. After receiving the wafer onto the handling device the wafer can be transported together with the handling device. A further advantage of the present invention lies in the fact that the handling device according to the invention and the handling method according to the invention not only ensure very gentle fixing or detachment of the wafer, but at the same time, owing to slow enlargement of the contact surface between wafer and adhesive membrane, the extremely thin wafers can be planarised (levelled) since the adhesive membrane, starting from at least one small first contact surface, spreads slowly and therefore gently over the surface of the wafer, and in particular over the whole surface. The device according to the invention and the method according to the invention are suitable not only for holding and transporting the extremely thin wafers described but also for holding and transporting standard wafers, or parts thereof, in particular with a thickness of approximately 300 to 800 µm. According to the invention membrane or adhesive membrane is taken to mean a flexible, flat element with an adhesive or gluing effect or with an adhesive or gluing layer for fixing the wafer. The adhesive membrane is preferably impermeable to pressurising medium.

In one embodiment it is advantageously provided that a gel film known per se is used as the adhesive membrane. Gel films have a gel layer which is used on the one hand to hold the wafer and on the other hand to even out irregularities on the surface of the wafer.

According to an expedient embodiment of the invention the adhesive membrane is fixed to a receiving body. The receiving body is part of the handling device and in one development of the invention, together with the adhesive membrane, forms the wall or boundary of the workspace. The receiving body should, as a rule, be rigid, so when the workspace is pressurised with pressurising medium the workspace only expands in the region of the adhesive membrane. The workspace is preferably pressurising means-tight, and this is achieved in that the adhesive membrane is joined to the receiving body so as to be correspondingly sealed.

To allow central introduction of the detaching and receiving forces onto the wafer, in one development of the invention it is provided that the adhesive membrane expands in the manner of a balloon when subject to pressurising medium. The contact surface reduces with this expansion process, depending on the development of the receiving body. To detach a fixed wafer, by way of example, the volume of the workspace is enlarged, whereby the contact surface, and therewith the adhesive forces between wafer and adhesive membrane, are reduced. Conversely, during the fixing process the volume of the workspace is reduced, and therewith the contact surface enlarged, whereby the adhesive forces are also increased. A balloon-like change in the workspace when subject to pressurising medium can be achieved according to a preferred embodiment in that the adhesive membrane has a rounded, in particular circular, peripheral contour.

There exists a plurality of possibilities for forming the abutment face of the receiving body, on which the adhesive membrane rests, in particular with minimal workspace volume. It is thus possible for the abutment face to be flat. In addition a structured, in particular undulated or matrix-like, construction is advantageous to hereby allow uniform and easy detachment of the wafer. A structured abutment face can even out the contact pressure onto the wafer, in particular when pressing onto a surface opposite to the abutment face.

According to an expedient development of the invention a porous material is arranged in at least one workspace, wherein the abutment face for the wafer is formed by the porous material. A contact pressure can be exerted on the wafer by the porous material via the adhesive membrane if the wafer rests on an appropriate opposite surface. The porous structure of the material allows penetration of the pressurising medium through to the adhesive membrane arranged on the porous material.

So the fixing process or the detachment process can take place at different points of the wafer in staggered time intervals, i.e. in a temporal sequence, it is provided in one embodiment of the invention that the adhesive membrane delimits a plurality of workspaces, wherein the workspaces can be individually supplied with pressurising medium. It is hereby possible to allow the contact surface to grow or shrink more quickly in some regions of the wafer surface than others. Contact no longer has to start centrally, but can, for example, start from an edge point.

Differently developed porous materials are preferably provided in the various workspaces, whereby the thin wafer can be deformed easily and in a controlled manner as it is deposited.

BRIEF DESCRIPTION OF THE DRAWINGS

Further advantages and expedient embodiments of the invention are recited in the further claims, the figures, description and drawings, in which:

DETAILED DESCRIPTION OF PREFERRED EMBODIMENTS

Figure 1:
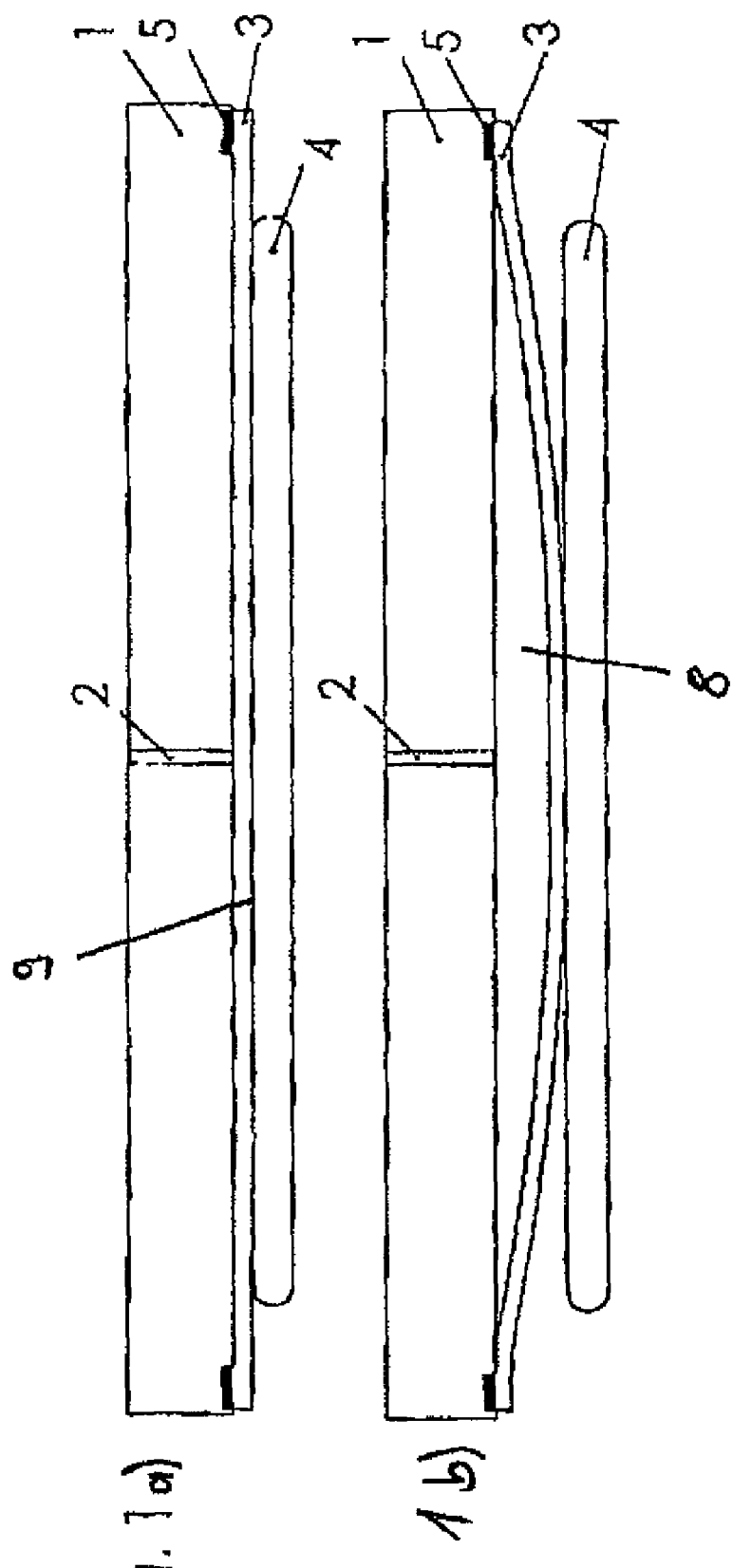
FIG. 1a shows a handling device with adhesive membrane, wherein the volume of the workspace is minimal owing to the application of a vacuum.
FIG. 1b shows the handling device of FIG. 1a with workspace pressurised by pressurising medium.

Identical components and components with the same function are identified by the same reference numerals in the figures.

FIGS. 1a and 1b show a first embodiment of a handling device. The transportable handling device, which can be moved in particular by means of a robot, substantially comprises a rigid receiving body 1 with a substantially circular cross-section. A pipe 2 for feeding and removing pressurising medium into a workspace 8 is shown passing through the receiving body 1 and is delimited by the receiving body 1 and an adhesive membrane 3 constructed as a gel film. The adhesive membrane 3 with circular cross-section is fixed at the edge by a combined sealing and adhesive layer 5 to the receiving body 1. Further fixing means, in particular screws or clamping mechanisms, can optionally be provided.

In FIG. 1a the volume of the workspace is virtually zero since a vacuum is applied to the workspace 8 via the pipe 2, whereby the adhesive membrane 3 in turn rests flat against a level supporting surface 7 of the receiving body 1. A circular contact surface 9 between a thin wafer 4 and the adhesive membrane 3 is maximal hereby. The contact surface 9 substantially matches the overall surface of a flat side of a wafer. With this maximal contact surface 9 the adhesive forces between wafer 4 and adhesive membrane 3 or between wafer 4 and the handling device are also maximal.

To deposit the wafer 4 pressurising medium, in particular compressed air, is supplied via the pipe 2 into the workspace 8, whereby the workspace 8 or the adhesive membrane 3 enlarges in a balloon-like manner, whereby, in turn, the contact surface 9, in association with a reduction in the adhesive forces, is reduced. The wafer 4 can be removed hereby, in particular by lifting the receiving body 1. During the receiving process, starting from the state shown in FIG. 1b, the state shown in FIG. 1a is adjusted, in other words the contact surface 9 is continuously maximised, starting from the centre of the wafer, wherein the receiving body 1 approaches the wafer 4 during maximisation of the contact surface 9.

Figure 2:
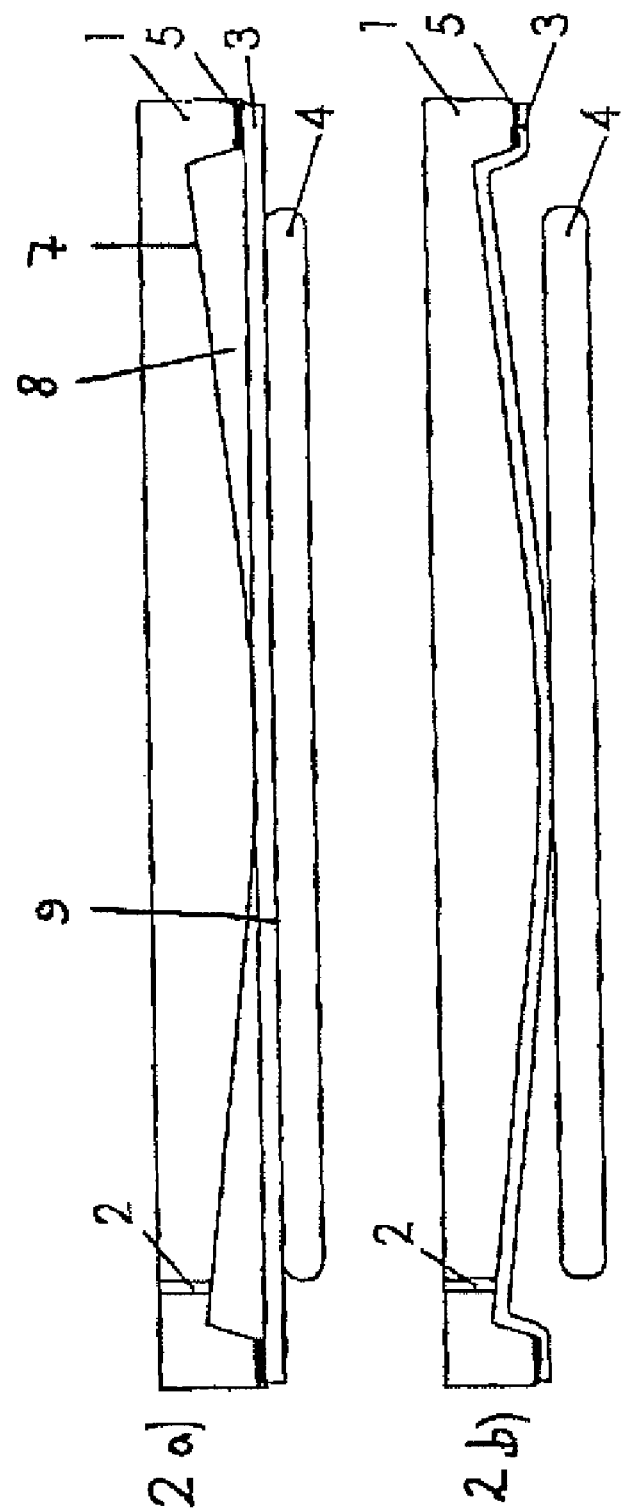
FIG. 2a shows a further embodiment of a handling device, wherein the contact surface between adhesive membrane and wafer is maximal.
FIG. 2b shows the handling device according to FIG. 2a, wherein the volume of the workspace is minimal owing to the application of a vacuum and the contact surface between adhesive membrane and wafer is minimal.

In contrast to the embodiment of FIGS. 1a and 1b, in the embodiment according to FIGS. 2a and 2b the contact surface 9 is reduced by applying a vacuum. In FIG. 2a the contact surface 9 is maximal, as is the volume of the workspace 8. This is achieved in that the abutment face 7 for abutment of the adhesive membrane 3 is convex. It is hereby possible to contact the wafer 4 firstly only in the central region and, for example by applying atmospheric pressure, starting from the state according to FIG. 2b, to adjust the state according to FIG. 2a and thereby allow the wafer 4 to be gently received. On the other hand, by applying a vacuum to the pipe 2, starting from the state according to FIG. 2a, the state according to FIG. 2b can be adjusted, whereby it is possible to gently deposit the wafer 4.

Figure 3:
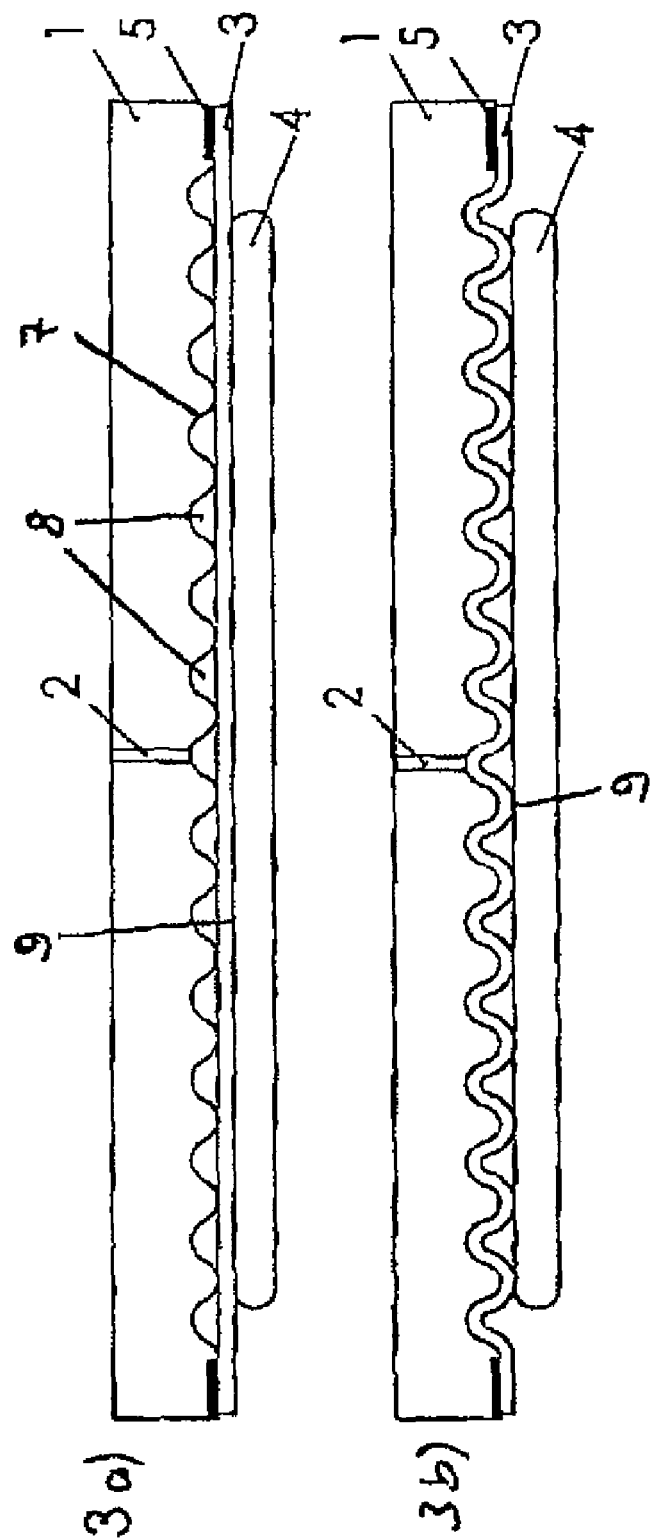
FIG. 3a shows a third embodiment of a handling device, wherein an abutment face of a receiving body has an undulating structure and the contact surface between adhesive membrane and wafer is maximal.
FIG. 3b shows the handling device according to FIG. 3a with vacuum applied to the workspace and minimal contact surface resulting thereby.

In the embodiment according to FIGS. 3a and 3b the abutment face 7 is undulated or corrugated. The undulated design can also be implemented offset by 90° hereto, resulting in a matrix-like structure of the abutment surface 7. By applying a vacuum to the pipe 2 the adhesive membrane 3 is drawn onto the structured abutment face 7 of the receiving body 1 with interlocking fit. A reduction in the contact surface 9 of the adhesive membrane 3 with the wafer 4 is achieved hereby, whereby slight loosening of the wafer 4 is possible. In particular, before application of a vacuum to the pipe 2, a contact pressure can be exerted on the wafer 4, before detachment at a substrate, by means of the receiving body 1 and the undulation crests of the structured abutment face 7, or the wafer 4, can be pressed via the undulation crests onto another wafer (not shown), for example for bonding. The adhesive membrane 3 is used in this case inter alia for evening-out the contact pressure of the receiving body 1. In the state according to FIG. 3*a*, i.e. when the workspace 8 is at its maximum size, the contact surface 9 between wafer 4 and adhesive membrane 3 is maximal. When the vacuum is applied (cf. FIG. 3*b*) the contact surface 9 is minimal.

Figure 4:
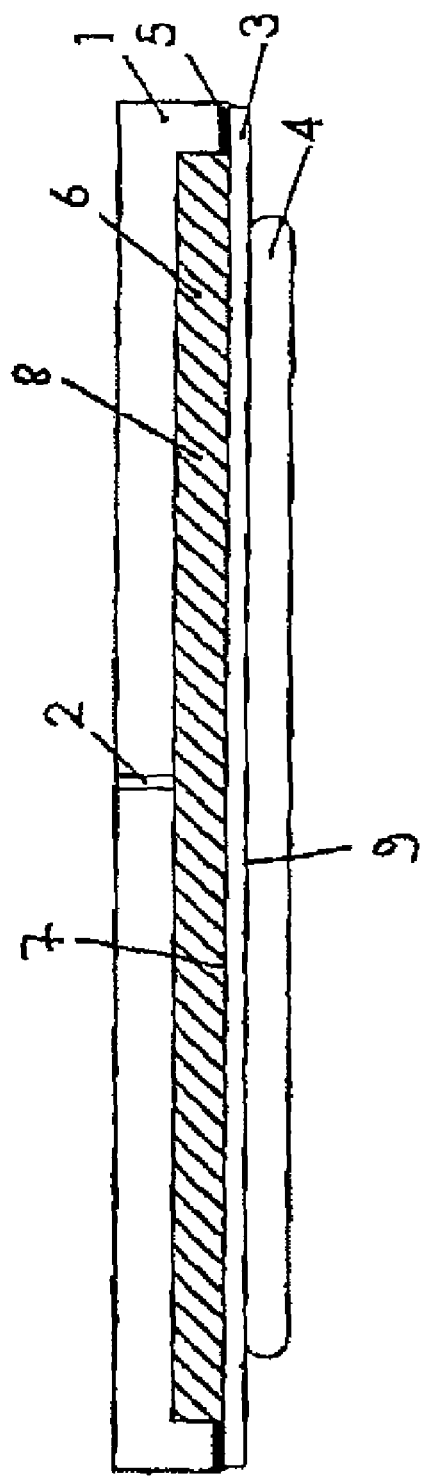
FIG. 4 shows a fourth embodiment of a handling device in which the single workspace is filled with porous material.

In the embodiment according to FIG. 4 the entire workspace 8 is filled by a porous material 6 or a porous insert. A contact pressure can be exerted on the wafer 4, where a corresponding opposite surface exists, through the porous, resistant material 6 via the adhesive membrane 3.

Figure 5:
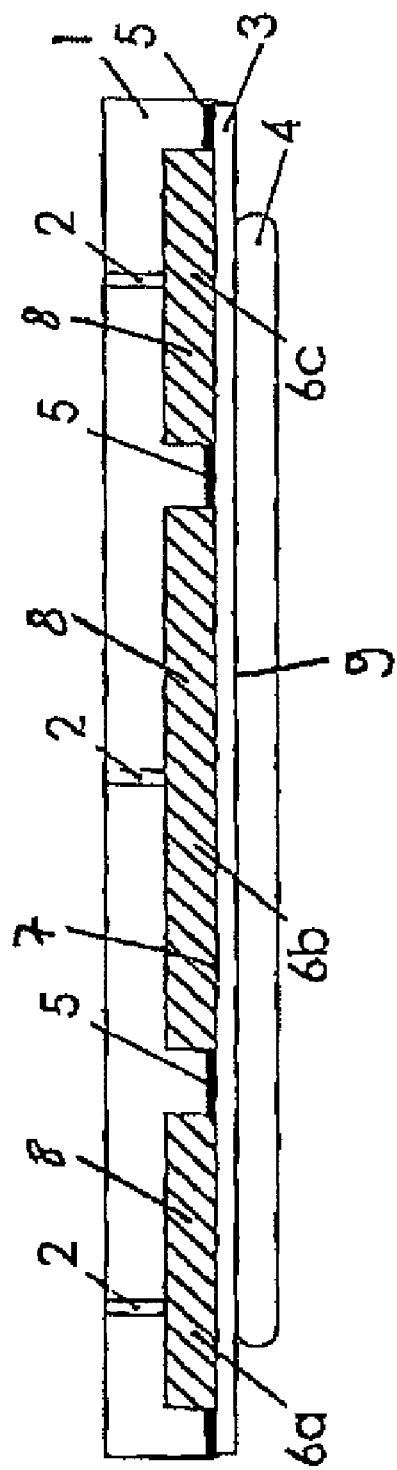
FIG. 5 shows a fifth embodiment of a handling device with three workspaces that are physically separated and sealed from each other and are each filled with porous material.

In the embodiment according to FIG. 5 three physically separate workspaces 8 are provided, wherein each workspace 8 can be supplied with pressurising medium or a vacuum by a separate pipe 2. In the illustrated embodiment each workspace 8 is filled with porous material 6*a*, 6*b*, 6*c*. Individual or all workspaces 8 do not necessarily have to contain porous material however, but can be substantially empty. By the temporally and/or quantitively different supply of pressurising medium via the different lines 2 to the respective workspaces 8, or by temporally staggered application of a vacuum, it is possible to define the point(s) of contact of the wafer 4 with an opposite surface (not shown). Thus for example by applying a pressure to the, in the plane of the drawing, left, workspace 8, while simultaneously applying atmospheric pressure to the, in the plane of the drawing, middle, workspace 8 and applying a vacuum to the, in the plane of the drawing, right, workspace 8, first contact of the wafer 4 with the opposite surface (not shown) opposing the workspace 8 located in the left-hand half of the drawing takes place. For some applications it is advantageous if, when receiving the wafer 4, contact between the adhesive membrane 3 and the wafer 4 does not start centrally but from a different point. It is thus possible for example to start the receiving process or contact between the adhesive membrane 3 and the wafer 4 starting from the workspace 8 situated in the right-hand half of the drawing. By different configuration of the abutment faces 7 formed by the porous materials 6*a*, 6*b*, 6*c* the thin wafer 4 can be deformed in a controlled manner as it is deposited and/or received.

Figure 6:
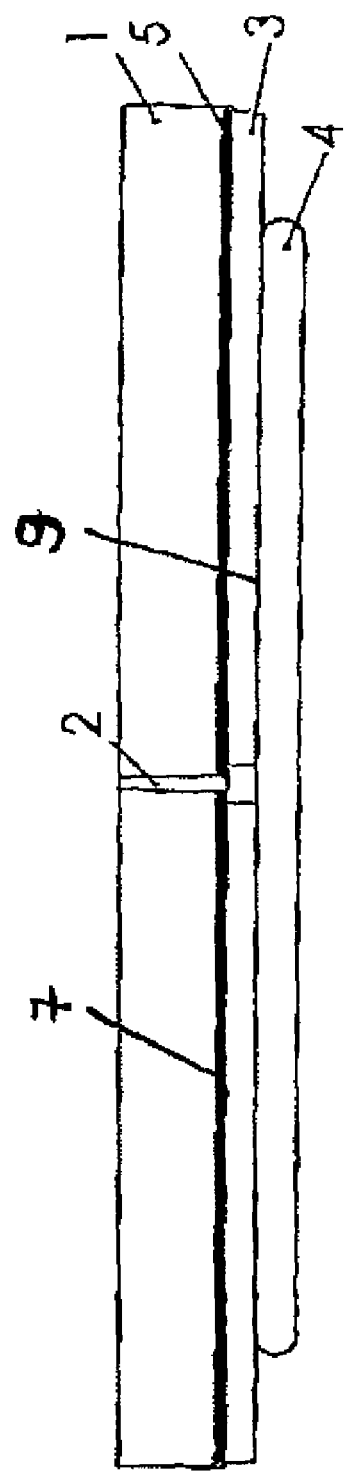
FIG. 6 shows a sixth embodiment of a handling device in which there is a connection between the interior of the workspace and the surface of the wafer.

In the embodiment according to FIG. 6 the supply pipe 2 is led up to the wafer 4. Detachment of the wafer 4 from the adhesive membrane 3 when pressurised with pressurising medium can be accelerated hereby since the pressurising medium immediately arrives between adhesive membrane 3 and wafer 4.

Having described the invention, the following is claimed:

1. Handling device for wafers (4) with a thickness of less than 800 μm, said handling device comprised of:
    a receiving body (1); and
    an adhesive membrane (3) attached to the receiving body (1) for detachably fixing the wafer (4) thereto;
    wherein a single supply pipe (2) extends through the adhesive membrane (3) and the receiving body (1) and wherein pressurizing medium can be supplied via the single supply pipe (2) between the adhesive membrane (3) and the wafer (4) to detach the wafer (4) from the adhesive membrane (3).

2. Handling device according to claim 1, wherein the adhesive membrane (3) is a gel film.

3. Handling device according to claim 1, wherein the adhesive membrane (3) comprises a rounded, peripheral contour.

4. Handling device according to claim 3, wherein the peripheral contour of the adhesive membrane (3) is circular.

5. Handling device according to claim 1, wherein the single supply pipe (2) is arranged centrally with regard to the adhesive membrane (3).

6. A method for handling wafers (4) with a thickness of less than 800 μm, the method comprising the steps of:
    providing a receiving body (1) and an adhesive membrane (3) detachably affixable to wafer (4), wherein the adhesive membrane (3) is attached to the receiving body (1) and a single supply pipe (2) extends through the adhesive membrane (3) and the receiving body (1) and wherein pressurizing medium can be supplied via the single supply pipe (2) between the adhesive membrane (3) and the wafer (4) to detach the wafer (4) from the adhesive membrane (3); and
    reducing or enlarging a contact surface (9) between the adhesive membrane (3) and wafer (4) by supplying or removing a pressurizing medium into or from the single supply pipe (2).

7. Handling method according to claim 6, wherein the contact surface (9) is reduced for detaching the wafer (4) and/or enlarged for fixing the wafer (4).

* * * * *